US011719870B2

(12) United States Patent
Lo et al.

(10) Patent No.: US 11,719,870 B2
(45) Date of Patent: Aug. 8, 2023

(54) ALL-AROUND CURVED POLARIZER

(71) Applicant: BenQ Materials Corporation, Taoyuan (TW)

(72) Inventors: Ming-Shing Lo, Taoyuan (TW); Jian Hung Wu, Taoyuan (TW); Hisn Hsing Li, Taoyuan (TW); Mao-Sung Huang, Taoyuan (TW)

(73) Assignee: BenQ Materials Corporation, Taoyuan (TW)

( * ) Notice: Subject to any disclaimer, the term of this patent is extended or adjusted under 35 U.S.C. 154(b) by 51 days.

(21) Appl. No.: 17/673,911

(22) Filed: Feb. 23, 2022

(65) Prior Publication Data

US 2023/0072560 A1    Mar. 9, 2023

(30) Foreign Application Priority Data

Aug. 26, 2021    (TW) ................... 110131592

(51) Int. Cl.
| G02B 5/30 | (2006.01) |
| G02B 1/08 | (2006.01) |
| G02B 1/14 | (2015.01) |
| G02F 1/1335 | (2006.01) |

(52) U.S. Cl.
CPC ............... G02B 5/305 (2013.01); G02B 1/08 (2013.01); G02B 1/14 (2015.01); G02B 5/3033 (2013.01); C09K 2323/03 (2020.08); G02F 1/133541 (2021.01)

(58) Field of Classification Search
CPC ....... G02F 1/133541; G02B 1/08; G02B 1/14; G02B 5/3033; G02B 5/305; C09K 2323/03
See application file for complete search history.

(56) References Cited

FOREIGN PATENT DOCUMENTS

| KR | 20170021755 A | * | 2/2017 | ............... G02B 1/14 |
| TW | 776657 B1 | * | 9/2022 | ............... G02B 1/08 |

* cited by examiner

*Primary Examiner* — Sophie Hon

(57) ABSTRACT

An all-around curved polarizer for an all-around curved display device comprises a polarizing layer, a first protective layer and a second protective layer. The first protective layer is arranged on a side of the polarizing layer adjacent to the all-around curved display device and has a first coefficient of thermal expansion. The second protective layer is disposed on the other side of the polarizing layer opposite to the all-around curved display device, and has a second coefficient of thermal expansion, and the second coefficient of thermal expansion is greater than the first coefficient of thermal expansion of the first protective layer.

8 Claims, 5 Drawing Sheets

ALL-AROUND CURVED POLARIZER

CROSS-REFERENCE TO RELATED APPLICATION

This application claims the benefit of TW invention application serial No. 110131592, filed on Aug. 26, 2021, the subject matter of which is incorporated herein by reference.

FIELD OF THE INVENTION

The present invention relates to an all-around curved polarizer and particularly, related to an all-around curved polarizer which comprises a flat display area surrounded with a continuous curved display area formed by four curved edge sides and four corners for applying to an all-around display device.

BACKGROUND OF THE INVENTION

The requirements for hand-held display device are more and more, and especially the appearance and the screen-to-body ratio. For increasing the screen-to-body ratio of the hand-held device, one of the solutions is to reduce the width of the phone bezel and to curve the side edges to form curved display areas. This solution is not only to increase the screen-to-body ratio but also to be more comfortable to hold. The display device, either liquid crystal display (LCD) or Organic Light-Emitting Diode (OLED) can be in curved form which can be manufactured by specific manufacturing process or can be originated from the material properties. FIG. 1 is a perspective view of a mobile device with a curved display area on some sides in the prior art. The display area 2 of the hand-held device 1 has a flat display area 2a and curved display area 2b at one side or both side with a fix curvature. Because it is generally difficult for a display panel to have a continuous curved display image at the both adjacent long-side and short-side or around the four sides of the flat display area 2a, that is, including the edge sides and corner areas at the same time, the display design is limited.

In the current display manufacturing process, it is better to use OLED device instead of LCD, due to the more flexibility thereof, to provide a distortion-free at the side edges and four corners by specific pixel design and the manufacturing process. The bezel and back-housing for the hand-held device with no displaying functions can be manufactured by casting or thermopressing to fit the curved display device. However, the current display device has at least one optical film, such as a polarizer, for performing desired optical properties or lowering the reflection of the environmental light. A polarizer is usually a composed film with multiple layers, such as a polarizing layer having an absorption axis and a retardation film, and is manufactured by stretching in a horizontal direction along the film surface, coating, and laminating via roll-to-roll processes to have an absorption axis or retardation axis in a single direction. Therefore, when pressing or thermopressing the polarizer in the thickness direction for molding to fit the curved edges of the display, the stress received at the individual layer, the side edges, the four corners of the polarizer are different to result in the absorption axis and the retardation changed, which caused the light leakage, color shift, moire or the like occurring at the curved display area. Thus, the desired optical properties cannot be achieved. And if the optical film is fully heated, like a non-optical film material such as the bezel and the housing of general display devices, to the softening point of the optical film (usually above 200° C.) to lower the film modulus for thermopressing, the polarity of the polarizing layer will be destroyed by the high temperature. Therefore, because the process temperature of the thermopressing cannot be high (usually between 85° C. and 125° C. for less than 15 seconds), the processability of the current polarizer structure directly subjected to be curved by thermopressing is in a low yield rate due to the defect appearance of the molded products. Since the optical properties and the appearance of the current polarizer with curved edge sides together with four corners is unsatisfied, the design for display device with a continuously curved display area around is also limited.

The inventors disclose an all-around curved polarizer which comprises a flat display area surrounded with a continuous curved display area formed by four curved edge sides and four corners. An all-around display device applied with the disclosed all-around curved polarizer can show a good image effect and a good appearance.

SUMMARY OF THE INVENTION

The present inventors disclose an all-around curved polarizer to provide a solution for the current products.

The present invention is to provide an all-around curved polarizer for an all-around curved display device, which comprises a polarizing layer, a first protective layer disposed at a side of the polarizing layer facing to the all-around curved display device and having a first coefficient of thermal expansion and a second protective layer disposed at the other side of the polarizing layer opposed to the all-around curved display device and having a second coefficient of thermal expansion, wherein the second coefficient of thermal expansion is more than the first coefficient of thermal expansion of the first protective layer.

In a preferred embodiment of the all-around curved polarizer of the present invention, the all-around curved polarizer comprises a flat display area and a curved display area surrounding the flat display area.

In a preferred embodiment of the all-around curved polarizer of the present invention, the first coefficient of the thermal expansion of the first protective layer is between $10 \times 10^{-6}/°C.$ and $20 \times 10^{-6}/°C.$, the second coefficient of thermal expansion of the second protective layer is between $25 \times 10^{-6}/°C.$ and $40 \times 10^{-6}/°C.$ In a preferred embodiment of the all-around curved polarizer of the present invention, the flat display area includes four corners, and each of the four corners has a radius of curvature R1 between 5 mm and 10 mm.

In a preferred embodiment of the all-around curved polarizer of the present invention, the cross-sectional radius of curvature R2 of the curved display area along the thickness direction is between 2 mm and 6 mm.

In a preferred embodiment of the all-around curved polarizer of the present invention, the thickness of the first protective layer is less than or equal to the thickness of the second protective layer.

In a preferred embodiment of the all-around curved polarizer of the present invention, the thickness of the first protective layer is between 20 μm and 80 μm, and the thickness of the second protective layer is between 40 μm and 80 μm.

In a preferred embodiment of the all-around curved polarizer of the present invention, the first protective layer is a retardation film with a quarter-wavelength retardation to make the all-around curved polarizer be a circular polarizer.

In a preferred embodiment of the all-around curved polarizer of the present invention, the all-around curved polarizer further comprises a quarter-wavelength plate (λ/4 plate) disposed adjacent to the first protective layer to make the all-around curved polarizer to be an all-around curved circular polarizer.

In a preferred embodiment of the all-around curved polarizer of the present invention, the first protective layer and the second protective layer are independently selected from one of the group consisting of polyimide, polyethylene terephthalate, polymethyl methacrylate, cyclo-olefin polymer, epoxy resin, polysiloxane and cellulose acetate polymer and the like.

DETAILED DESCRIPTION OF THE DISCLOSURE

With reference to the following more detailed description and claims taken in conjunction with the accompanying drawings. The purpose of the drawings is only for illustrating the present invention and may not exhibit the true proportions and precise configuration. Thus, the drawings cannot be used limit the concept and scope of the present invention. The present disclosure is only defined by the appended claims.

The following description together with the accompanying drawings is to illustrate embodiments of the wound treatment system of the present invention. For understanding, the same elements in the following embodiments are described with the same symbols.

Figure 1:
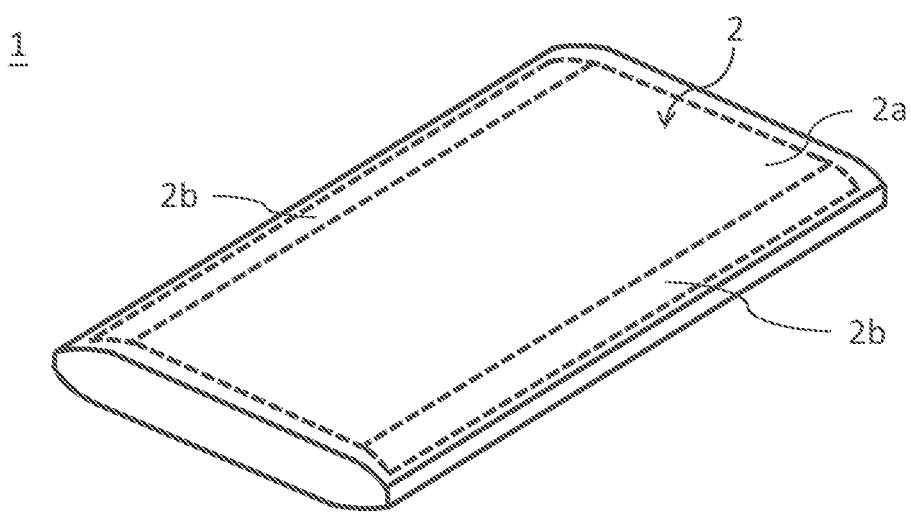
FIG. 1 is a perspective view of a conventional mobile device with a curved display area.
Figure 2:
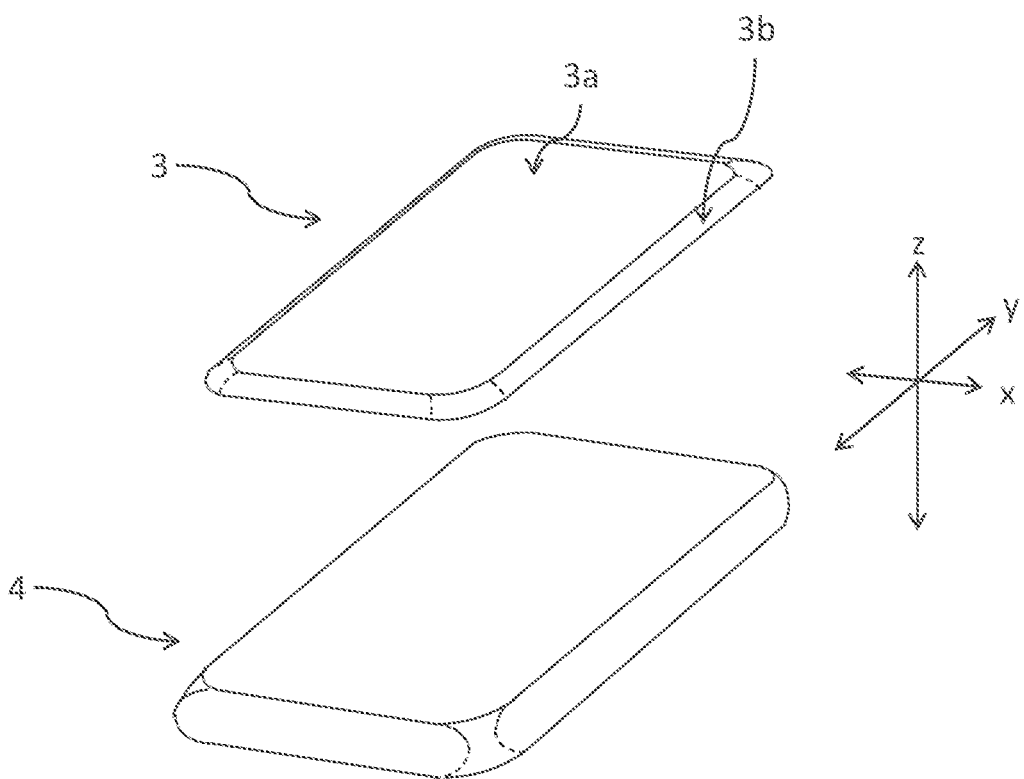
FIG. 2 is a perspective view of an all-around curved polarizer for an all-around curved display device of an embodiment of the present invention.
Figure 3A:
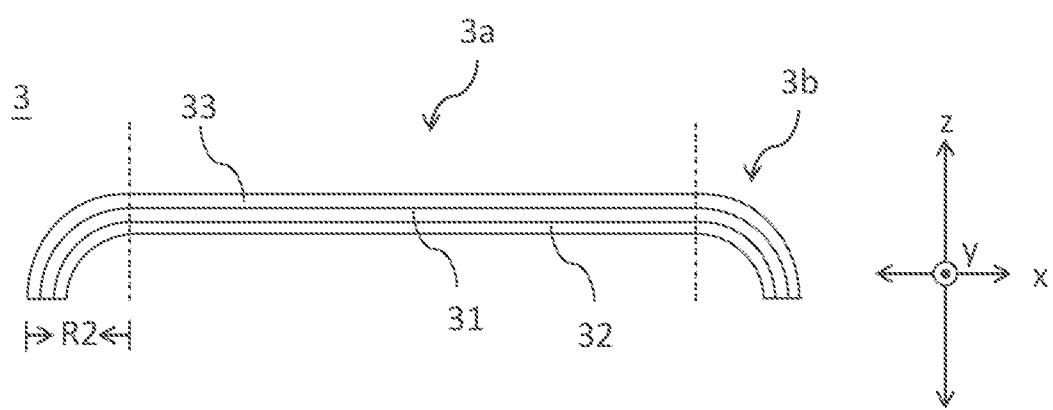
FIG. 3A is a cross-sectional view of an all-around curved polarizer of an embodiment of the present invention.

Referring to FIGS. 2 and 3A, FIG. 2 is a perspective view of an all-around curved polarizer 3 for an all-around curved display device 4 of an embodiment of the present invention and FIG. 3A is a cross-sectional view of the all-around curved polarizer 3. The all-around curved polarizer 3 comprises a polarizing layer 31, a first protective layer 32 disposed at a side of the polarizing layer 31 facing to the all-around curved display device 4 and having a first coefficient of thermal expansion, and a second protective layer 33 disposed at the other side of the polarizing layer 31 opposed to the all-around curved display device 4 and having a second coefficient of thermal expansion, wherein the second coefficient of thermal expansion is more than the first coefficient of thermal expansion of the first protective layer 32. The all-around curved polarizer 3 comprises a flat display area 3a and a curved display area 3b surrounding the flat display area 3a.

Herein, the coefficient of thermal expansion (CTE) described in the present invention is a one-dimensional linear coefficient of thermal expansion. The coefficient of thermal expansion can be obtained by the Formula (1), wherein the coefficient of thermal expansion a is a fractional rate of the dimension change from the length ($L_{25°\,C.}$) of a long-strip film at room temperature 25° C. to the length ($L_{85°\,C.}$) of the long-strip film heated to 85° C. in relation to the original length ($L_{25°\,C.}$) per 1° C. increased.

$$\alpha = (L_{85°\,C.} - L_{25°\,C.})/L_{25°\,C.}(85°\,C. - 25°\,C.) \quad \text{Formula (1)}$$

In an embodiment of the present all-around curved polarizer, the first coefficient of the thermal expansion of the first protective layer 32 is between $10 \times 10^{-6}/°$ C. and $20 \times 10^{-6}/°$ C., and the second coefficient of thermal expansion of the second protective layer 33 is between $25 \times 10^{-6}/°$ C. and $40 \times 10^{-6}/°$ C.

Figure 3B:
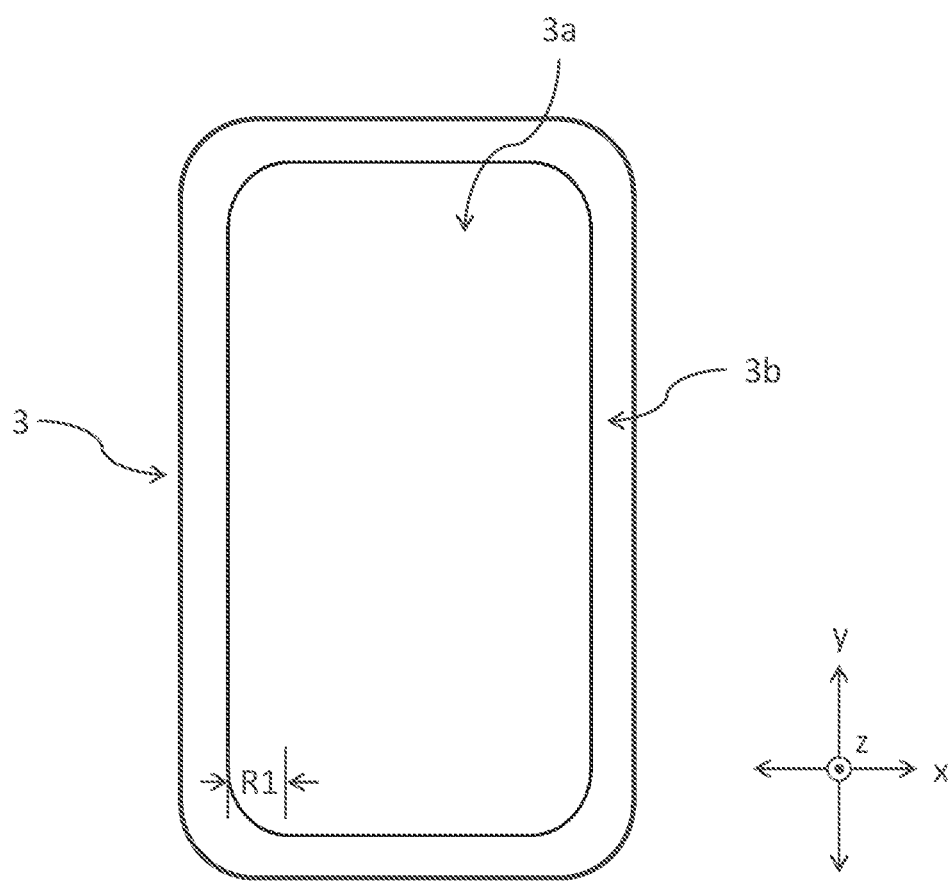
FIG. 3B is a top view of an all-around curved polarizer of an embodiment of the present invention.

FIG. 3B is a top view of the all-around curved polarizer of the present invention. In a preferred embodiment of the present all-around curved polarizer 3, the flat display area 3a in x-y plane includes four corners, and each of the four corners has a radius of curvature R1 between 5 mm and 10 mm.

In other embodiments of the present all-around curved polarizer with reference to FIG. 3A, according to the application type of display devices and the thickness thereof, the required radius of curvature in thickness direction is decreased with the thickness of the display, such as the mobile phone, the tablet, the watch or the like. The cross-sectional radius of curvature R2 of the curved display area 3b of the all-around curved polarizer 3 in thickness direction (i.e. the cross-section in z-axis) is preferred between 2 mm and 6 mm to satisfy the market demand to commercial portable devices with curved edges.

In other embodiments of the present all-around curved polarizer, because the first protective layer 32 is disposed at the inner side and the second protective layer 33 is disposed at the outer side, and the required expansion of the first protective layer 32 is less than that of the second protective layer 33, so the thickness of the first protective layer 32 is preferably less than or equal to the thickness of the second protective layer 33.

In a preferred embodiments of the present all-around curved polarizer, the thickness of the first protective layer is between 20 μm and 80 μm, and the thickness of the second protective layer 33 is between 40 μm and 80 μm.

In a preferred embodiments of the present all-around curved polarizer, the first protective layer 32 is a retardation film with a quarter-wavelength retardation to make the all-around curved polarizer 3 be a circular polarizer.

Figure 4:
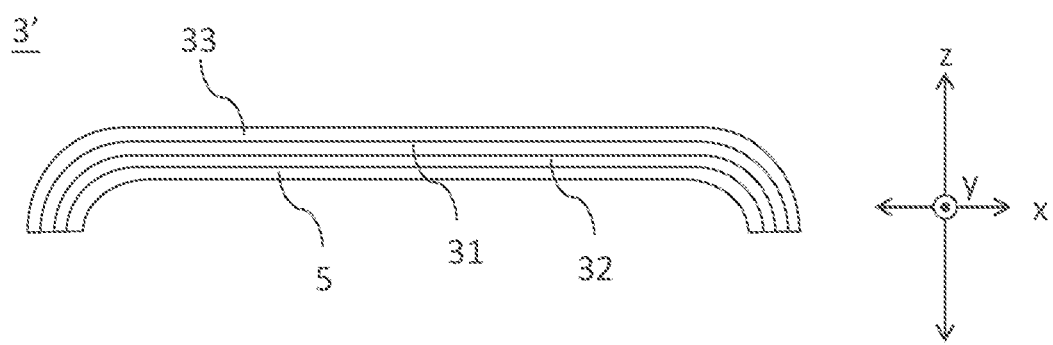
FIG. 4 is of an all-around curved polarizer of another embodiment of the present invention.

Referring to FIG. 4, in an embodiment of the present all-around curved polarizer, the all-around curved polarizer 3' further comprises a quarter-wavelength plate (λ/4 plate) 5 disposed adjacent to the first protective layer 32 to make the all-around curved polarizer 3' be an all-around curved circular polarizer.

In a preferred embodiments of the present all-around curved polarizer, the materials of the first protective layer 32 and the second protective layer 33 independently can be but not limited to polyimide, polyethylene terephthalate, polymethyl methacrylate, cyclo-olefin polymer, epoxy resin, polysiloxane, cellulose acetate polymer or the like. The materials for the protective films are selected based on the strain thereof after being heated which satisfies the above-mentioned relation of the coefficient of thermal expansion.

The present invention will be explained in further detail with reference to the examples. However, the present invention is not limited to these examples.

EXAMPLE

Example 1

An all-around curved polarizer was prepared in Example 1, wherein the polarizing layer was a stretched iodine-type polarizing layer, and a first protective layer was a cellulose triacetate (TAC) film with a coefficient of thermal expansion of $11.3\times10^{-6}/°$ C. (thickness 40 µm, commercially available from Fujifilm, Japan), and the second protective layer was a polymethyl methacrylate (PMMA) film with a coefficient of thermal expansion of $31.7\times10^{-6}/°$ C. (thickness 40 µm, commercially available from Toyo Kohan Co., Ltd.). The polarizer was heated to 120° C. for 8 seconds and thermopress molded to force the second protective layer toward the first protective layer bending. The radius of curvature R1 is set to 6 mm, and the radius of curvature R2 is set to 2.6 mm Commonly, the radius of curvature R2 of the cross-sectional plane in the thickness direction is less, the bending stress suffered is more. The more bending stress results in the deformation during thermopress molding process. Thus, in this Example, the radius of curvature R2 was 2.6 mm to obtain an all-around curved polarizer with a flat display area and a curved display area surrounding the flat display area. Next, the edge of the polarizer was trimmed by laser cutting or the like process.

Example 2

An all-around curved polarizer was prepared in Example 2, wherein the polarizing layer was a stretched iodine-type polarizing layer, and the first protective layer was a cellulose triacetate (TAC) film with a coefficient of thermal expansion of $11.3\times10^{-6}/°$ C. (thickness 40 µm, commercially available from Fujifilm, Japan), and the second protective layer was a polyethylene terephthalate (PET) film with a coefficient of thermal expansion of $35.6\times10^{-6}/°$ C. (thickness 80 µm, commercially available from Toyobo, Japan). The polarizer was heated to 120° C. for 8 seconds and thermopress molded to force the second protective layer toward the first protective layer bending, with a radius of curvature R1 of 6 mm and a radius of curvature R2 of 2.6 mm. The all-around curved polarizer was formed with a flat display area and a curved display area surrounding the flat display area. Next, the edge of the curved display area of the polarizer was trimmed by laser cutting or the like process.

Comparative Example 1

An all-around curved polarizer was prepared in the Comparative Example 1, wherein the polarizing layer was a stretched iodine-type polarizing layer, and a first protective layer was a PET film (thickness 80 µm, commercially available from Toyobo) with a coefficient of thermal expansion of $35.6\times10^{-6}/°$ C., and a second protective layer was a TAC film (thickness 80 µm, commercially available from Fujifilm) PET film with a coefficient of thermal expansion $10.3\times10^{-6}/°$ C. The polarizer was heated to 120° C. for 8 seconds and thermopress molded to force the second protective layer toward the first protective layer bending to prepare an all-around curved polarizer with a flat display area and a curved display area surrounding the flat display area, wherein the radius of curvature R1 was set to 6 mm, and the radius of curvature R2 was set to 2.6 mm. The all-around curved polarizer was evaluated and compared in the same way as the Examples. Next, the edge of the curved display area of the polarizer was trimmed by laser cutting or the like process.

Comparative Example 2

An all-around curved polarizer was prepared in the Comparative Example 2, wherein the polarizing layer was a stretched iodine-type polarizing layer, and both the first protective layer and the second protective layer were PET films (thickness 80 µm, commercially available from Toyobo) with a coefficient of thermal expansion of $35.6\times10^{-6}/°$ C. The polarizer was heated to 120° C. for 8 seconds and thermopress molded to force the second protective layer toward the first protective layer bending to prepare an all-around curved polarizer with a flat display area and a curved display area surrounding the flat display area, wherein the radius of curvature R1 was set to 6 mm, and the radius of curvature R2 was set to 2.6 mm Next, the edge of the curved display area of the polarizer was trimmed by laser cutting or the like process.

Comparative Example 3

An all-around curved polarizer was prepared in the Comparative Example 3, wherein the polarizing layer was a stretched iodine-type polarizing layer, and both the first protective layer and the second protective layer were TAC films (thickness 40 µm, commercially available from Fujifilm) with a coefficient of thermal expansion of $11.3\times10^{-6}/°$ C. The polarizer was heated to 120° C. for 8 seconds and thermopress molded to force the second protective layer toward the first protective layer bending to prepare an all-around curved polarizer with a flat display area and a curved display area surrounding the flat display area, wherein the radius of curvature R1 was set to 6 mm, and the radius of curvature R2 was set to 2.6 mm Next, the edge of the curved display area of the polarizer was trimmed by laser cutting or the like process.

Comparative Example 4

An all-around curved polarizer was prepared in the Comparative Example 4, wherein the polarizing layer was a stretched iodine-type polarizing layer, and the first protective layer was a PMMA film (thickness 40 µm, commercially available from Toyo Kohan Co., Ltd.) with a coefficient of thermal expansion of $31.7\times10^{-6}/°$ C., and a second protective layer was a TAC film (thickness 40 µm, commercially available from Fujifilm) with a coefficient of thermal expansion of $11.3\times10^{-6}/°$ C. The polarizer was heated to 120° C. for 8 seconds and thermopress molded to force the second protective layer toward the first protective layer bending to prepare an all-around curved polarizer with a flat display area and a curved display area surrounding the flat display area, wherein the radius of curvature R1 was set to 6 mm, and the radius of curvature R2 was set to 2.6 mm Next, the edge of the curved display area of the polarizer was trimmed by laser cutting or the like process.

The all-around curved polarizers obtained from the Examples and the Comparative Examples were evaluated the accuracy of the optical axis, the flatness of the edge appearance, film warpage, curvature deviation. The evaluation results were listed in Table 1. Because the all-around curved polarizer of the present invention not only has a single-dimensional absorption axis like the current plane polarizer, but also has a three-dimensional absorption axis change after being thermopressed to be molded into to a three dimensional shape. Thus, the optical properties of the present all-around curved polarizer cannot be determined by the common measuring instrument for a polarizer with single linear absorption axis. The present all-around curved polarizer was laminated with another standard all-around curved polarizer with each other's absorption axis in a perpendicular direction. The laminated all-around curved polarizers were evaluated by visual observation via a backlight module to see if any light leakage occurred at edge sides and four corners to determine the accuracy of the absorption axis. The evaluation criteria were if the optical properties at the side edges and four corners of the curved display area and the optical properties at flat display area were consistent. If any area appeared an obvious light leakage and/or moire, the all-around curved polarizer marked as (X) to represent the deviation of the absorption axis. If the bright and dark level was uniform, the all-around curved polarizer marked as (○) to represent that the optical axis of these area was accurate. The flatness of the edge appearance was evaluated by visual observation. If creases appeared on side angle marked as (X), slightly twisted deformation, wrinkles appeared marked as (Δ), no obvious defects marked as (○). The warpage measurement was determined by placing the all-around curved polarizer on a flat base and measuring the highest height of each corner to the flat base. If the warpage height of the polarizer is more than or equal to 8 mm, it would be adversely to the polarizer aligned to the display during the later process for adhering to the display and then, the warpage marked as (X); the height of the warpage between 5 mm and 8 mm, the warpage marked as (Δ), less than or equal to 5 mm, the warpage marked as (○). The curvature deviation of the appearance of the polarizer was measured by the Wide-area 3D Measurement System (VR-5000, KEYENCE) to determine the contour of the all-around curved polarizer, configure and calculate the curvature deviation of the side edges and four corners. If the curvature deviated from the set value more than or equal to 5%, the curvature deviation marked as (X); if the curvature deviated from the set value between 1% and 5%, the curvature deviation marked as (Δ); and if the curvature deviated from the set value less than or equal to 1%, the curvature deviation marked as (○).

TABLE 1

| | | Example 1 | Example 2 | Comparative Example 1 | Comparative Example 2 | Comparative Example 3 | Comparative Example 4 |
|---|---|---|---|---|---|---|---|
| Appearance | Edge flatness | ○ | ○ | Δ | X | X | X |
| | Warpage | ○ | ○ | X | Δ | X | X |
| | Curvature deviation | ○ | ○ | X | Δ | X | X |
| Optical property | side angle light leakage | ○ | ○ | X | ○ | X | X |

As seen from Table 1, when the all-around curved polarizer of Examples 1 and 2 molding to be curved, because the second coefficient of thermal expansion of the second protective layer at the outer side was higher than the first coefficient of thermal expansion of the first protective layer at the inner side, no matter that the thickness of the first protective layer is less than or equal to the thickness of the second protective layer, the all-around curved polarizer had satisfied optical properties and appearance. On the other hand, when the polarizer as obtained in Comparative Examples was molding to be curved, because the second coefficient of thermal expansion of the second protective layer at the outer side was less than the first coefficient of thermal expansion of the first protective layer at the inner side, the optical axis at the curved area of the all-around curved polarizer was shifted to result in light leakage or poor appearance at the edges and corners. The defects of the polarizer as obtained in Comparative Examples affected the subsequent processing and laminating so as to be unable to obtain an all-around curved polarizer with satisfied optical properties and appearance. Thus, the polarizer as obtained in Comparative Examples was not suitable for all-around curved display device.

Although particular embodiments have been shown and described, it should be understood that the above discussion is not intended to limit the present invention to these embodiments. Persons skilled in the art will understand that various changes and modifications may be made without departing from the scope of the present invention as literally and equivalently covered by the following claims.

What is claimed is:

1. An all-around curved polarizer for an all-around curved display device, comprising:
    a polarizing layer;
    a first protective layer disposed at a side of the polarizing layer facing to the all-around curved display device and having a first coefficient of thermal expansion; and
    a second protective layer disposed at the other side of the polarizing layer opposed to the all-around curved display device and having a second coefficient of thermal expansion;
    wherein the all-around curved polarizer comprises a flat display area and a curved display area surrounding the flat display area; and
    wherein the first coefficient of the thermal expansion of the first protective layer is between $10*10^{-6}/°$ C. and $20*10^{-6}/°$ C., and the second coefficient of thermal expansion of the second protective layer is between $25*10/°$ C. and $40*10^{-6}/°$C.

2. The all-around curved polarizer as claimed in claim 1, wherein the flat display area includes four corners, and each of the four corners has a radius of curvature R1 between 5 mm and 10 mm.

3. The all-around curved polarizer as claimed in claim 1, wherein the cross-sectional radius of curvature R2 of the curved display area along the thickness direction is between 2 mm and 6 mm.

4. The all-around curved polarizer as claimed in claim 1, wherein the thickness of the first protective layer is less than or equal to the thickness of the second protective layer.

5. The all-around curved polarizer as claimed in claim 4, wherein the thickness of the first protective layer is between 20 μm and 80μm, and the thickness of the second protective layer is between 40 μm and 80 μm.

6. The all-around curved polarizer as claimed in claim 1, wherein the first protective layer is a retardation film with a quarter-wavelength retardation which makes the all-around curved polarizer into an all-around curved circular polarizer.

7. The all-around curved polarizer as claimed in claim 1, further comprising a quarter- wavelength plate (λ/4 plate)

disposed adjacent to the first protective layer which makes the all-around curved polarizer into an all-around curved circular polarizer.

8. The all-around curved polarizer as claimed in claim 1, wherein the first protective layer and the second protective layer are independently selected from one of the group consisting of polyimide, polyethylene terephthalate, polymethyl methacrylate, cyclo-olefin polymer, epoxy resin, polysiloxane and cellulose acetate polymer.

* * * * *